United States Patent [19]

Cummings et al.

[11] Patent Number: 5,372,670
[45] Date of Patent: Dec. 13, 1994

[54] SYSTEM FOR WET APPLICATION OF A DRY FILM TO A PANEL

[75] Inventors: Michael J. Cummings, Vestal, N.Y.; John M. Griffin, Friendsville, Pa.; Curtis L. Miller, Vestal, N.Y.

[73] Assignee: International Business Machines Corporation, Armonk, N.Y.

[21] Appl. No.: 190,422

[22] Filed: Feb. 2, 1994

[51] Int. Cl.⁵ ............................................. B32B 31/10
[52] U.S. Cl. ................................. 156/390; 156/536; 156/550; 156/555; 156/578; 118/114; 118/249; 118/258; 427/96; 427/211
[58] Field of Search ............... 156/555, 578, 389, 390, 156/536, 547, 549, 550, 281, 241; 118/249, 258, 114–116, 121; 427/96, 211

[56] References Cited

U.S. PATENT DOCUMENTS

| | | | |
|---|---|---|---|
| 3,629,036 | 12/1971 | Isaacson | 156/241 X |
| 3,930,930 | 1/1976 | De Keyser et al. | |
| 4,069,076 | 1/1978 | Fickes | 156/247 X |
| 4,269,138 | 5/1981 | Dinella et al. | |
| 4,405,394 | 9/1983 | Cohen | 156/308.6 X |
| 4,698,294 | 10/1987 | Lau et al. | 156/241 X |
| 4,710,257 | 1/1987 | Mattei et al. | |
| 4,976,817 | 12/1990 | Correa et al. | 118/249 X |
| 4,983,248 | 1/1991 | Seki | 156/555 X |
| 4,986,873 | 1/1991 | Hamamura | 118/249 X |
| 5,053,099 | 10/1991 | Seki et al. | |
| 5,102,491 | 4/1992 | Correa et al. | 156/550 |
| 5,112,428 | 5/1992 | Correa et al. | |
| 5,125,999 | 6/1992 | Sumi et al. | 156/281 |
| 5,212,041 | 5/1993 | Wanat | |

OTHER PUBLICATIONS

IBM Technical Disclosure Bulletin, vol. 33, No. 1B, Jun. 1990.

Primary Examiner—Jeff H. Aftergut
Attorney, Agent, or Firm—Calfee Halter & Griswold

[57] ABSTRACT

A system for wet application of a dry film, such as a photoresist, to a generally planar panel having upper and lower surfaces, such as a printed circuit board, is provided. The apparatus comprises rotatable upper and lower wetting rollers each having an absorbent material such as neoprene on the surface thereof, and a mechanism for holding the upper wetting roller in forcible contact with the lower wetting roller so that rotation of the lower wetting roller is translated into rotation of the upper wetting roller. The lower wetting roller is positioned at least partially within a container providing a supply of wetting agent, such as water, such that the wetting agent is in contact with the absorbent material on the surface of the lower wetting roller. Wetting agent absorbed by the absorbent material on the lower wetting roller is transferred to the absorbent material on the upper wetting roller when the upper and lower wetting rollers are rotated, and wetting agent absorbed by the absorbent material on the upper and lower rollers, respectively, is transferred to the upper and lower surfaces of the panel to wet the surfaces when the panel is drawn through the rollers. A pair of upper and lower film supply rolls are provided for applying layers of film, respectively, on the upper and lower wetted surfaces of the panel, and a pair of upper and lower cure rollers are provided for curing the upper and lower surfaces of the panel having film applied thereon.

23 Claims, 5 Drawing Sheets

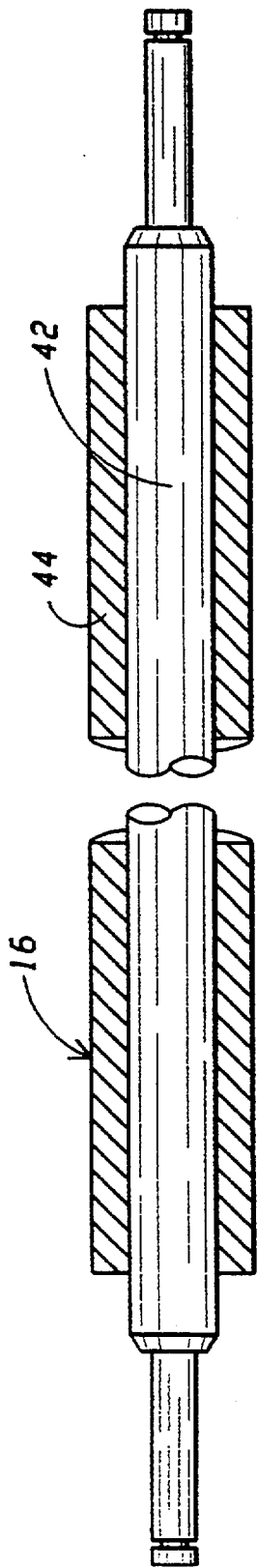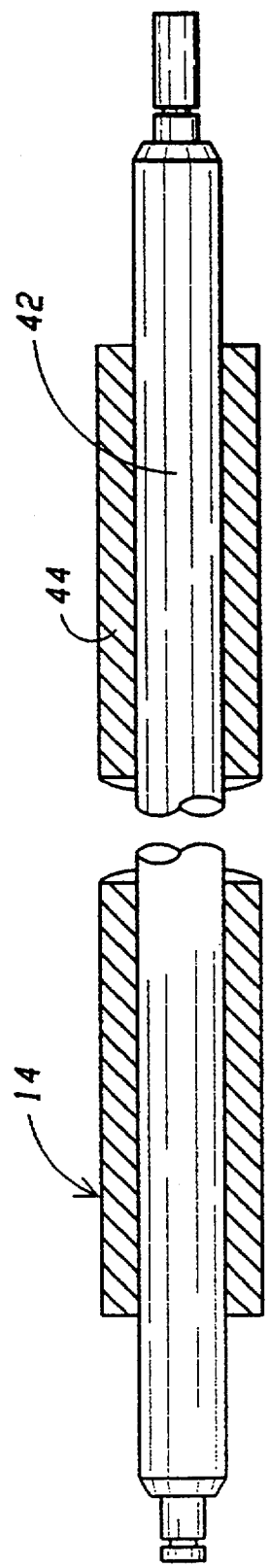
FIG. 2
FIG. 3

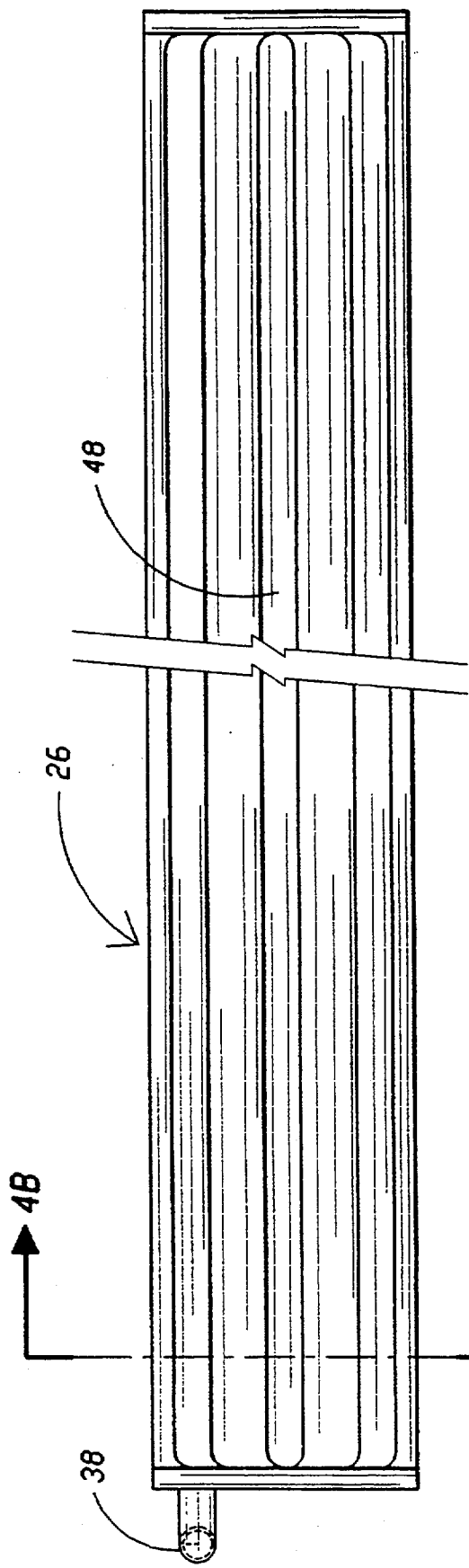
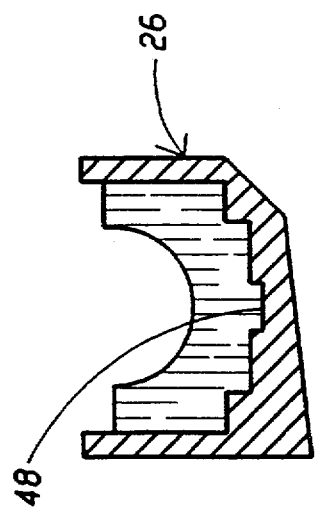

SYSTEM FOR WET APPLICATION OF A DRY FILM TO A PANEL

FIELD OF THE INVENTION

The present invention relates generally to the process of manufacturing electronic circuit boards and more particularly to a system for wet application of a dry film photoresist to such circuit boards.

BACKGROUND OF THE INVENTION

Photolithographic processes are essential to the field of microelectronics. Accurate, reproducible lines with widths of only a few microns ($\mu$m) must be routinely produced on integrated circuit boards or panels by exposing photosensitive materials to ultraviolet light through masks which have been photolithographically fabricated.

One type of photosensitive material used to produce photographic images in integrated circuit panels is a photoresist. Photoresists are photosensitive polymers which are resistant to attack by chemicals and vapors, and are thus suitable for the photoengraving techniques which form the basis of microelectronics. Photoresists further exhibit film-forming properties and are reasonably adherent to various surfaces.

Photoresists are classified as either positive photoresists or negative photoresists. Negative photoresists become insoluble when exposed to light. Positive photoresists, on the other hand, become soluble when exposed to light. Positive photoresists are generally more expensive to produce and more expensive to use than are negative photoresists. The energy required to expose them is greater, resulting in a longer exposure time and a resulting reduction in throughput. A distinct advantage of positive photoresists is that patterns can be delineated as small as the thickness of the photoresist layer, thereby making it possible to define lines on a panel as small as 1 $\mu$m with a 1 $\mu$m layer of positive photoresist.

Negative photoresists are available in the form of a dry film sandwiched between a polyester film and a polyolefin film. The photoresist is applied by removing the polyolefin film and using heat and pressure to cause it to adhere to the panel as a laminate.

Processes and systems for laminating photoresists onto a panel for the manufacture of circuit boards are known. One such process involves the application of a liquid to the surfaces of the panel to interact with the photoresist, prior to application of the photoresist. The fluid improves the flow characteristics of the photoresist and improves its adherence to the surface of the panel. This type of wet lamination process is disclosed in U.S. Pat. No. 5,112,428 to Correa, et al.

Such known wet lamination processes, however, suffer from several drawbacks. Typically, the processes involve complex controls to meter liquid flow and complicated roller designs to apply the liquid to the panel. The complex controls necessarily require significant operator intervention to insure that the proper amount of liquid is applied to the panel. Frequent fluctuations in wetting performance are common and result in less than optimum product yields.

In addition, known systems which apply fluid to a panel, to promote adhesion of a material such as a photoresist thereto, include rollers made from, or covered with, materials that may disintegrate during operation. Such disintegration may cause product contamination or mechanical breakdown. Known roller materials which suffer from this drawback include cloth which may separate into fibers. Periodic replacement of these types of rollers result in reduced product yields.

Moreover, such designs do not work well with ordinary tap water, which is an inexpensive, yet effective adhesion promoter for photoresist materials. The high mineral content of ordinary tap water may cause corrosion of the rollers, as well as sedimentary buildup on the rollers and other portions of the device. The use of ordinary tap water with these devices requires separate filtration systems for the water and frequent system preventative maintenance and cleaning to remove mineral deposits.

Still further, known systems do not provide sufficient means for insuring that both the top and the bottom of the panel are wetted adequately. Typical designs are horizontally oriented such that visual verification of the wetting of the bottom of a board passing therethrough is not possible.

It is an object of the present invention, therefore, to provide an apparatus and method for improved wet application of a dry film to a generally planar panel having upper and lower surfaces, which apparatus and method do not require complex controls or excessive operator intervention, and which provide an optimal product yield.

It is a further object of the present invention to provide such an apparatus and method which incorporate roller materials which resist disintegration, which utilize ordinary tap water as a process material, and which facilitate easy visual verification of adequate top and bottom surface wetting.

It is still a further object of the present invention to provide an apparatus and method for uniformly applying a liquid to a generally planar panel having upper and lower surfaces, in applications outside of those relating to printed circuit board manufacture.

SUMMARY OF THE INVENTION

A system for wet application of a dry film to a panel is provided. In one embodiment, the wetting agent is water, the dry film is a photoresist and the panel is an electronic printed circuit board. However, the inventive process and system may be useful in other processes involving the uniform application of a liquid to uniformly wet both sides of a planar panel.

The system comprises a pair of upper and lower wetting rollers, a pair of upper and lower film supply rolls, and a pair of upper and lower cure rollers. Each of the upper and lower wetting rollers comprises a stainless steel base drum surrounded by a layer of absorbent material such as neoprene. The lower wetting roller resides at least partially within a wetting agent supply tray which contains a liquid wetting agent, such that the roller is at least partially submerged in the wetting agent. Rotation of the lower wetting roller causes the absorbent material on the surface thereof to absorb some of the wetting agent in the tray.

The surfaces of the upper and lower wetting rollers are held forcibly in contact with each other so that rotation of the lower roller imparts a corresponding rotational movement to the surface of the upper roller. Absorbed wetting agent is transferred from the lower wetting roller to the upper wetting roller via rolling contact therewith.

The panel to be processed is positioned at the nip between the upper and lower wetting rollers and rotation of these rollers draws the panel therethrough. As the panel is drawn through the nip between the upper and lower wetting rollers, absorbed wetting agent is uniformly applied to the upper and lower surfaces of the panel. Intermediate processing of subsequent panels, the lower wetting roller is rotated within the wetting agent supply tray so that wetting agent continues to be absorbed by the upper and lower wetting roller absorbent surfaces.

The system permits easy visual inspection of the amount of wetting agent applied to the panel. Because the wetting agent is initially supplied to the lower wetting roller, an operator need only visually determine that the top surface of the panel is being sufficiently wetted in order to verify sufficient wetting of the bottom surface of the panel.

After the leading edge of the panel passes through the nip between the upper and lower wetting rollers, film such as a photoresist may be efficiently applied to the wetted surfaces. Photoresist leads from the film supply rolls are held in place on the surface of vacuum shoes attached to the cure rollers. The vacuum shoes move in a vertical direction toward each other to tack the leads, using heat and pressure, to the leading edge of the upper and lower panel surfaces.

After tacking, the vacuum shoes retract by moving in a vertical direction away from each other and the panel, and the vacuum is shut off so that photoresist unrolled from the supply rolls may pass freely over the surfaces of the vacuum shoes. The panel then passes through the cure rollers which apply heat and pressure to the nip therebetween to insure proper adhesion of the photoresist to the panel surfaces.

Once the panel has nearly traversed the cure rollers such that the trailing edge of the panel is adjacent the vacuum shoes, each web of photoresist from the upper and lower supply rolls is cut by a cutting assembly. The vacuum shoes are again energized so that the leads of the photoresist web are in a position suitable to permit them to be tacked to the leading edge of the next panel to be wetted by the wetting rollers. The lower wetting roller, having continued to turn while the cure rollers and the cutting assembly were operating, is thereby provided with sufficient time to transfer wetting agent to the upper wetting roller for the next wetting operation.

BRIEF DESCRIPTION OF THE DRAWINGS

FIG. 2 is a side sectional view of the lower wetting roller of the system of FIG. 1;

FIG. 3 is a side sectional view of the upper wetting roller of the system of FIG. 1;

FIGS. 4A and 4B, respectively, are top and end sectional views of the wetting agent tray of the system of FIG. 1;

DETAILED DESCRIPTION OF THE PREFERRED EMBODIMENT

Figure 1:
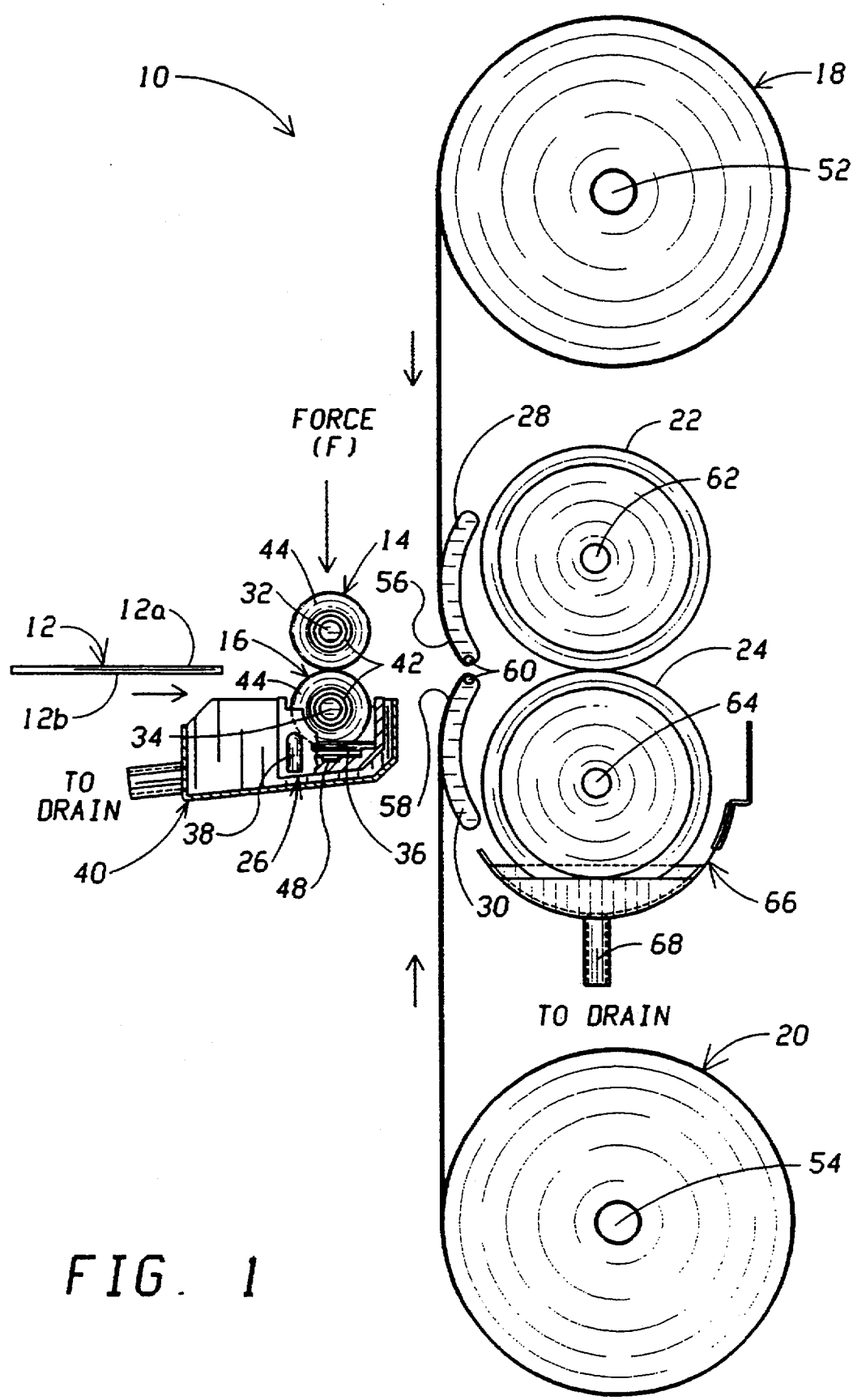
FIG. 1 is an end view of a system for wet application of a dry film to a panel, constructed according to the principles of the present invention.

A system 10 for wet application of a dry film such as a photoresist to a panel 12 is shown in FIG. 1. The system comprises a pair of upper and lower wetting rollers 14 and 16, respectively, a pair of upper and lower film supply rolls 18 and 20, respectively, and a pair of upper and lower cure rollers 22 and 24, respectively. The system further comprises a wetting agent supply container or tray 26 for the lower wetting roller 14 and upper and lower vacuum shoes 28 and 30, respectively, associated with the upper and lower cure rollers 22 and 24.

The operation of the upper and lower wetting rollers 14, 16 in connection with the wetting agent supply tray 26 provides a uniform wetting action for both the upper and lower surfaces of the panel 12 as it passes therethrough toward the cure rollers. In the preferred embodiment of the invention, the wetting agent is ordinary city tap water, the film is a photosensitive material such as a dry film photoresist and the panel 12 is an electronic printed circuit board. However, it is contemplated that the present invention has broader applications beyond that specifically disclosed, and may be applied to other processes involving the uniform application of a liquid to both sides of a planar panel.

The upper and lower wetting rollers 14, 16 are rotatably mounted to a frame (not shown) by means of axles 32 and 34, respectively. The axes of the axles run lengthwise along the rollers and extend into FIG. 1 as shown in side view. The axle 32 of the upper wetting roller 14 is moveable in a vertical direction so that it may be brought into and out of contact with the lower roller 16. As used herein, vertical means a direction parallel to a line which is both perpendicular to and connects axles 32 and 34.

The lower wetting roller 16 resides at least partially within the wetting agent supply tray 26 which contains a liquid wetting agent 36 such as water. The tray 26 includes an inlet (not shown) for providing the tray with a supply of liquid wetting agent and an outlet 38 for permitting the escape of excess wetting agent from the tray. A containment pan 40 located below the tray 26 catches the excess wetting agent escaping the tray through outlet 38 and funnels it to an appropriate drain. The containment pan 40 also catches any wetting agent which falls from the upper wetting roll 14 and is not caught by the tray 26 (see also FIGS. 4A-4B and 5A-5B).

The lower wetting roller 16 is located within the tray 26 such that the roller is at least partially submerged in the wetting agent 36. Accordingly, rotation of the lower wetting roller 16 will cause the entire surface of the lower roller to be exposed to the wetting agent. With the upper wetting roller 14 in contact with the lower roller 16, as shown in FIG. 1, rotation of the lower roller in a clockwise direction will impart a corresponding counterclockwise rotational movement to the surface of the upper roller to transfer wetting agent from the lower roller to the upper roller, in a manner more fully described hereinafter.

Each of the upper and lower wetting rollers 14, 16 comprises a base drum 42, which may be constructed from stainless steel or other material suitable for wet processing applications, surrounded by a layer 44 of absorbent material (see also FIGS. 2 and 3). In the preferred embodiment, the absorbent material is a neoprene rubber. The durometer hardness of the neoprene is preferably on the order of between 20–60, or about 40. A durometer hardness in this range promotes absorption of the wetting agent by both the upper and lower wetting rollers. A durometer hardness significantly greater than this range will result in insufficient absorption of wetting fluid by the upper and lower wetting rollers.

The lower wetting roller 16 is rotated intermediate the wetting of successive panels 12 to be processed. Thus, with no panel intermediate the upper and lower wetting rollers, wetting agent absorbed by the neoprene layer 44 on the lower roller 16 is permitted to be transferred to the neoprene layer on the upper roller 14. The upper roller 14 does not merely rest on the lower roller 16 but is instead forced into contact with the lower roller to insure that rotational movement of the lower roller is imparted to the upper roller and that a sufficient amount of wetting agent is transferred from the lower roller to the upper roller. The force may be provided by several suitable means, including (i) a spring loaded mechanism, (ii) pneumatic pressure or (iii) filling the drum 42 in the upper roller 14 with liquid (e.g. water) or a dense solid material.

The panel 12, having upper surface 12a and lower surface 12b, is moved in a horizontal direction along a horizontal inlet conveyor (not shown) which may, for example, comprise a plurality of rollers. As used herein, horizontal means a direction which is perpendicular to both the axles 32, 34 on the wetting rollers and the vertical direction as hereinbefore described. The rotational movement of the upper and lower rollers draws the panel through the nip therebetween, and the upper roller moves vertically upward a sufficient distance to provide clearance for the panel. The upper and lower surfaces 12a, 12b of the panel are thereby uniformly wetted with the wetting agent 36 as the panel passes through the nip.

The wetting agent supply tray 26 is provided with a groove 48 on the bottom thereof. The groove 48 traps any sediment or particulate matter, resulting from previous panel processing operations, which may fall into the tray from the panel or the upper and lower wetting rollers. Because wetting agent is constantly being supplied to the tray during operation of the system to replenish that absorbed by the wetting rollers and thereafter applied to the panel 12, the contents of the tray experience some degree of turbulence which might otherwise agitate the sediment in the tray. The groove 48 entraps this material so that the supply of wetting agent remains free of particulate matter and the non-contamination of the panels being wetted is insured.

The arrangement of the upper and lower wetting rollers 14, 16 and the wetting agent supply tray 26 permit easy visual inspection of the amount of wetting agent applied to the panel 12, and an easy verification that the bottom surface 12b as well as the top surface 12a have been sufficiently wetted. If, for example, it is determined by visual inspection that the top surface 12a of the panel is sufficiently wetted, the bottom surface 12b must also necessarily be sufficiently wetted, because the upper wetting roller 14 receives its wetting agent via absorbent transfer from the lower roller 16.

Once the leading edge of the panel 12 passes through the nip between the upper and lower wetting rollers, it is ready to have the film on the film supply rolls 18, 20, such as a photoresist, applied thereon. The upper and lower supply rolls 18, 20 of photoresist are rotatably mounted on axles 52 and 54, respectively. Photoresist leads 56 and 58 are held in place on the surface of vacuum shoes 28 and 30, respectively.

As the leading edge of the panel 12 reaches the vacuum shoes 28 and 30, the vacuum shoes move in a vertical direction toward each other and the upper and lower surfaces 12a, 12b of the panel, respectively. The horizontal movement of the panel is temporarily suspended, by stopping rotation of the lower wetting roller 16, while the ends of the photoresist leads 56 and 58 are tacked to the upper and lower panel surfaces. Tacking is accomplished through pressure applied to the panel surfaces by means of contact with the vacuum shoes and heat applied to the panel by means of a heated strip of rubber 60 extending the entire width of the panel on the end of each of the vacuum shoes.

Upon completion of the tacking process, the vacuum shoes 28, 30 retract by moving in a vertical direction away from each other and the panel 12. The vacuum is turned off so that photoresist unrolled from the supply rolls 18, 20 may pass freely over the surface of the vacuum shoes. Horizontal movement of the panel 12 is then resumed by again rotating the lower wetting roller 16, forcing the panel into the nip formed between the upper and lower cure rollers 22, 24.

Both the upper and lower cure rollers 22, 24 are rotatably driven via axles 62 and 64, respectively. Rotation of the cure rollers draws the panel therethrough, as well as the dry film photoresist which has been tacked on both the upper and lower surfaces of the panel. The supply rolls 18, 20 of photoresist are not rotatably driven and may in fact be provided with a brake to insure tension on the web of photoresist between the supply rolls and the nip between the cure rollers. The cure rollers apply heat and pressure to the nip therebetween to insure proper adhesion of the photoresist to the panel surfaces 12a, 12b. Because the photoresist is water-based, the wetting agent (i.e., water) promotes adhesion of the photoresist to the panel surfaces.

Because the pressure applied by the cure rollers to the panel 12 is greater than that applied to the panel by the wetting rollers, excess wetting agent may be squeezed off of the top and bottom surfaces of the panel by the cure rollers. Any such excess wetting agent removed falls into a cure roller drip pan 66 surrounding the lower portion of the lower cure roller 24 (see also FIGS. 6A–6B). An outlet 68 in the pan funnels the excess wetting agent to an appropriate drain.

Once the panel 12 has nearly traversed the cure rollers such that the trailing edge of the panel is adjacent the vacuum shoes, each web of photoresist from the upper and lower supply rolls is cut by a cutting assembly (not shown), and the vacuum shoes are again energized so that the leads 56 and 58 of the photoresist web are in a position to be applied to the leading edge of the next panel wetted by the wetting rollers 14, 16. The lower wetting roller 16, having continued to turn while the cure rollers and, subsequently, the cutting assembly were operating, has had time to transfer sufficient wetting agent to the upper wetting roller 14 for the next wetting operation.

FIGS. 2–6 are more detailed illustrations of various elements of the system 10 shown in FIG. 1. FIG. 2 is a side sectional view of the lower wetting roller 16, and FIG. 3 is a side sectional view of the upper wetting roller 14. Both FIGS. 2 and 3 illustrate the preferred construction of the upper and lower wetting rollers including the stainless steel drum 42 and the neoprene layer 44.

Figure 5A:
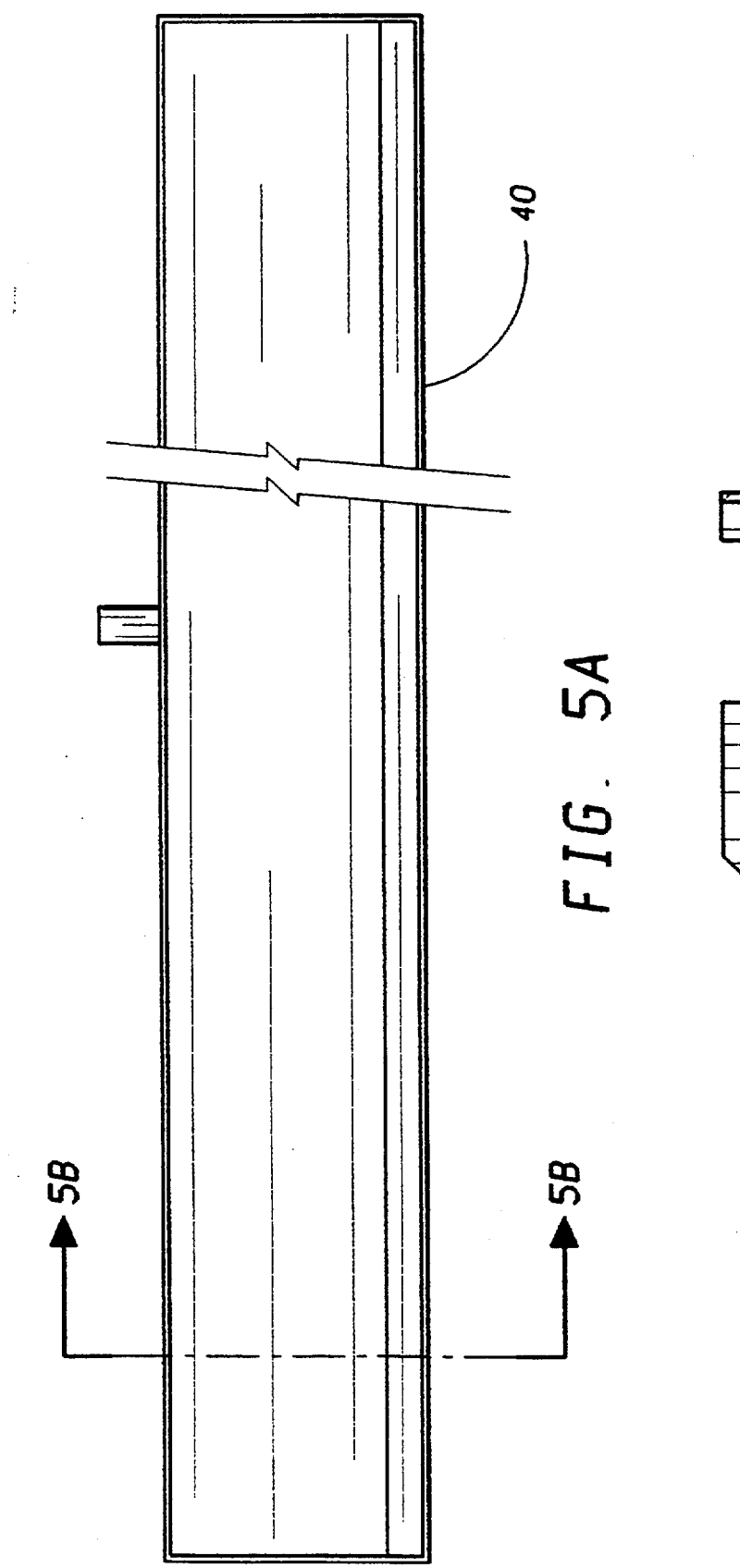
FIGS. 5A and 5B, respectively, are top and end sectional views of the containment pan of the system of FIG. 1.
Figure 5B:
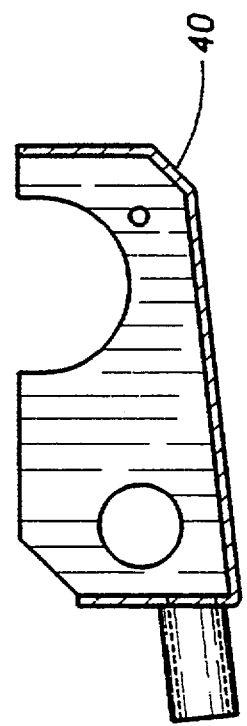
Figure 6A:
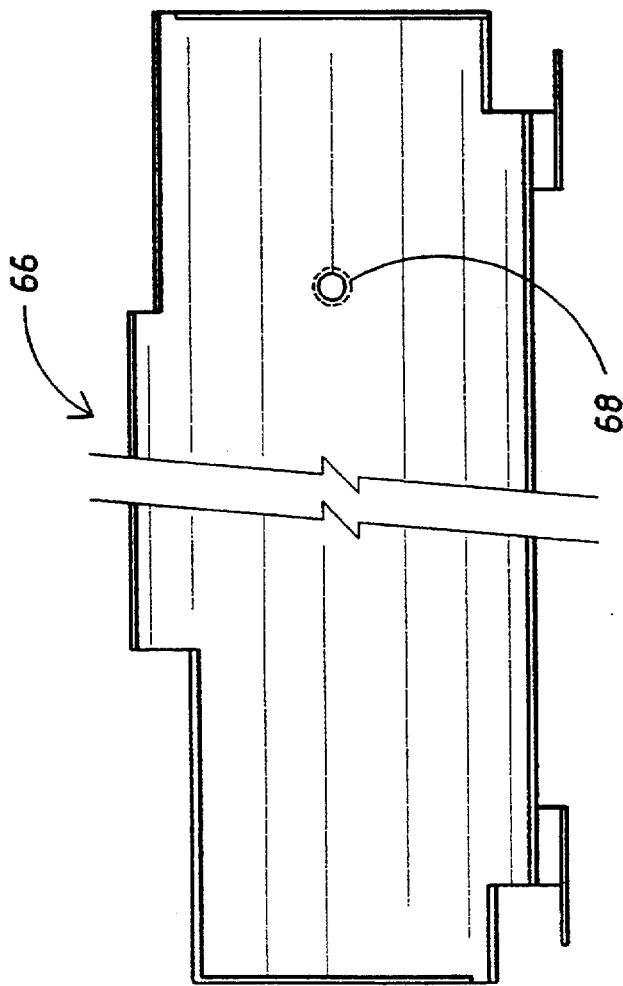
FIGS. 6A and 6B, respectively, are top and end sectional views of the cure roller drip pan of the system of FIG. 1.
Figure 6B:
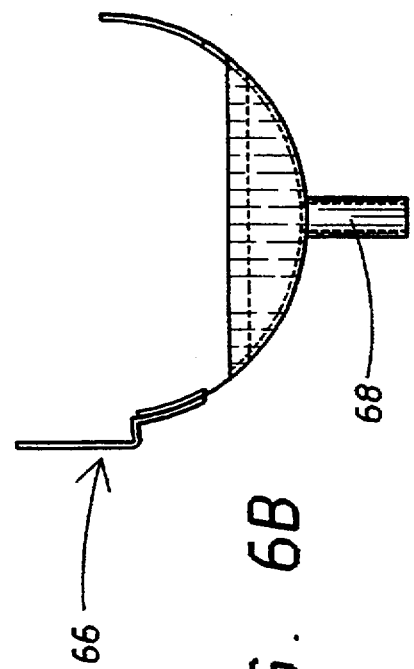

FIG. 4A is a top view of the wetting agent tray 26, showing the position of the groove 48 within the tray. FIG. 4B is an end sectional view of the tray 26. FIGS. 5A and 5B are a top view of the containment pan 40, and an end sectional view of the pan, respectively. FIG. 6A is a top view of the cure roller drip pan 66, showing the position of the outlet 68 extending from the pan. FIG. 6B is an end sectional view of the pan 66.

Accordingly, the preferred embodiment of a system for wet application of a dry film to a panel has been described. With the foregoing description in mind, however, it is understood that this description is made only by way of example, that the invention is not limited to the particular embodiments described herein, and that various rearrangements, modifications and substitutions may be implemented without departing from the true spirit of the invention as hereinafter claimed.

We claim:

1. An apparatus for wet application of a dry film to a generally planar panel having upper and lower surfaces, said apparatus comprising:
 a rotatable lower wetting roller and a rotatable upper wetting roller, each having an absorbent material on the surface thereof,
 a mechanism for holding said upper wetting roller in forcible contact with said lower wetting roller, whereby rotation of said lower wetting roller is translated into rotation of said upper wetting roller;
 a container providing a single supply of wetting agent in contact with said absorbent material on the surface of said lower wetting roller, said container provided with a groove on a bottom inner surface thereof to trap particulate matter present in said supply of wetting agent in said container, whereby wetting agent absorbed by said absorbent material on said lower wetting roller is transferred to said absorbent material on said upper wetting roller when said upper and lower wetting rollers are rotated;
 a mechanism for transferring the panel to a nip located between said upper and lower wetting rollers, whereby rotation of said upper and lower wetting rollers draws the panel through said nip and wetting agent absorbed by the absorbent material on said upper and lower rollers, respectively, is transferred to the upper and lower surfaces of the panel to wet said surfaces;
 a pair of upper and lower film supply rolls for applying layers of film, respectively, on said upper and lower wetted surfaces of said panel; and
 a pair of upper and lower cure rollers for curing said upper and lower surfaces of said panel having film applied thereon.

2. The apparatus of claim 1, wherein said lower wetting roller is positioned at least partially within said container.

3. The apparatus of claim 2, wherein said container is provided with a drain and is at least partially surrounded by a containment pan, said containment pan also provided with a drain.

4. The apparatus of claim 2, wherein said dry film is a photosensitive material.

5. The apparatus of claim 4, wherein said photosensitive material is a photoresist.

6. The apparatus of claim 5, wherein said wetting agent is water.

7. The apparatus of claim 6, wherein the panel is a printed circuit board.

8. The apparatus of claim 6, wherein said absorbent material on the surface of said upper and lower wetting rollers is neoprene.

9. The apparatus of claim 8, wherein said neoprene has a durometer hardness of between 20 and 60.

10. The apparatus of claim 8, wherein a drip pan at least partially surrounds said lower cure roller to receive excess wetting agent squeezed from said upper and lower surfaces of said panel by said cure rollers.

11. An apparatus for uniformly applying a liquid to a generally planar panel having upper and lower surfaces, said apparatus comprising:
 a rotatable lower wetting roller and a rotatable upper wetting roller, each having an absorbent material on the surface thereof,
 a mechanism for holding said upper wetting roller in forcible contact with said lower wetting roller, whereby rotation of said lower wetting roller is translated into rotation of said upper wetting roller;
 a container providing a single supply of liquid in contact with said absorbent material on the surface of said lower wetting roller, said container provided with a groove on a bottom inner surface thereof to trap particulate matter present in said supply of liquid in said container, whereby liquid absorbed by said absorbent material on said lower wetting roller is transferred to said absorbent material on said upper wetting roller when said upper and lower wetting rollers are rotated; and
 a mechanism for transferring the panel to a nip located between said upper and lower wetting rollers, whereby rotation of said upper and lower wetting rollers draws the panel through said nip and liquid absorbed by the absorbent material on said upper and lower rollers, respectively, is transferred to the upper and lower surfaces of the panel to wet said surfaces.

12. The apparatus of claim 11, wherein said lower wetting roller is positioned at least partially within said container.

13. The apparatus of claim 12, wherein said container is provided with a drain and is at least partially surrounded by a containment pan, said containment pan also provided with a drain.

14. The apparatus of claim 11, wherein said liquid is water.

15. The apparatus of claim 14, wherein the panel is a printed circuit board.

16. The apparatus of claim 14, wherein said absorbent material on the surface of said upper and lower wetting rollers is neoprene.

17. The apparatus of claim 16, wherein said neoprene has a durometer hardness of between 20 and 60.

18. A method of uniformly applying a liquid to a generally planar panel having upper and lower surfaces, said method comprising the steps of:
 disposing a lower wetting roller at least partially within a container providing a single supply of liquid so that absorbent material on the surface of said lower wetting roller is in contact with said liquid, said container provided with a groove on a bottom inner surface thereof to trap particulate matter present in said supply of liquid in said container;
 forcibly contacting the surface of said lower wetting roller with an absorbent material on the surface of an upper wetting roller, whereby rotation of said lower wetting roller is translated into rotation of said upper wetting roller, and whereby liquid absorbed by said absorbent material on said lower wetting roller is transferred to said absorbent material on said upper wetting roller when said upper and lower wetting rollers are rotated; and passing the panel to a nip located between said upper and lower wetting rollers, whereby rotation of said upper and lower wetting rollers draws the panel through said nip and liquid absorbed by the absorbent material on said upper and lower rollers, respectively, is transferred to the upper and lower surfaces of the panel to wet said surfaces.

19. The method of claim 18, wherein said container is provided with a drain and is at least partially surrounded by a containment pan, said containment pan also provided with a drain.

20. The method of claim 18, wherein said liquid is water.

21. The method of claim 24, wherein the panel is a printed circuit board.

22. The method of claim 20, wherein said absorbent material on the surface of said upper and lower wetting rollers is neoprene.

23. The method of claim 22, wherein said neoprene has a durometer hardness of between 20 and 60.

* * * * *